United States Patent
Foyet et al.

(10) Patent No.: US 9,512,529 B2
(45) Date of Patent: Dec. 6, 2016

(54) ELECTROPLATING BATHS OF SILVER AND TIN ALLOYS

(71) Applicant: Rohm and Haas Electronic Materials LLC, Marlborough, MA (US)

(72) Inventors: Adolphe Foyet, Luzernerstrasse (CH); Margit Clauss, Kriens (CH); Wan Zhang-Beglinger, Adligenswil (CH); Julia Woertink, Sudbury, MA (US); Yi Qin, Marlborough, MA (US); Jonathan Prange, Lincoln, MA (US); Pedro O Lopez Montesinos, Marlborough, MA (US)

(73) Assignee: Rohm and Haas Electronic Materials LLC

( * ) Notice: Subject to any disclaimer, the term of this patent is extended or adjusted under 35 U.S.C. 154(b) by 300 days.

(21) Appl. No.: 13/910,109

(22) Filed: Jun. 4, 2013

(65) Prior Publication Data

US 2014/0353162 A1    Dec. 4, 2014

(51) Int. Cl.
| | |
|---|---|
| *C25D 3/60* | (2006.01) |
| *H01L 23/00* | (2006.01) |
| *C25D 3/64* | (2006.01) |
| *C25D 5/50* | (2006.01) |
| *C25D 7/12* | (2006.01) |

(52) U.S. Cl.
CPC . *C25D 3/60* (2013.01); *C25D 3/64* (2013.01); *C25D 5/505* (2013.01); *C25D 7/123* (2013.01); *H01L 24/11* (2013.01); *H01L 24/13* (2013.01); *H01L 24/03* (2013.01); *H01L 24/05* (2013.01); *H01L 2224/0345* (2013.01); *H01L 2224/0361* (2013.01); *H01L 2224/03452* (2013.01); *H01L 2224/03462* (2013.01); *H01L 2224/03912* (2013.01); *H01L 2224/0401* (2013.01); *H01L 2224/05111* (2013.01); *H01L 2224/05147* (2013.01); *H01L 2224/05171* (2013.01); *H01L 2224/05611* (2013.01); *H01L 2224/05647* (2013.01); *H01L 2224/05655* (2013.01); *H01L 2224/1147* (2013.01); *H01L 2224/11462* (2013.01); *H01L 2224/11901* (2013.01); *H01L 2224/13111* (2013.01); *H01L 2924/01322* (2013.01)

(58) Field of Classification Search
CPC ............ C25D 3/30; C25D 3/32; C25D 3/46; C25D 3/60; C25D 3/64; C25D 5/505; C25D 7/123; H01L 24/11; H01L 24/13; H01L 24/05; H01L 24/03; H01L 2924/01322; H01L 2224/01322; H01L 2224/05147; H01L 2224/05171; H01L 2224/03912; H01L 2224/05611; H01L 2224/05111; H01L 2224/0401; H01L 2224/0361; H01L 2224/03452; H01L 2224/05655; H01L 2224/05647; H01L 2224/11901; H01L 2224/03462; H01L 2224/13111; H01L 2224/0345; H01L 2224/11462; H01L 2224/1147

See application file for complete search history.

(56) References Cited

U.S. PATENT DOCUMENTS

| | | |
|---|---|---|
| 3,778,259 A | 12/1973 | Viglione |
| 5,438,175 A | 8/1995 | Herklotz et al. |
| 5,514,261 A | 5/1996 | Herklotz et al. |
| 6,476,494 B1 | 11/2002 | Hur et al. |
| 6,527,840 B1 | 3/2003 | Igarashi et al. |
| 6,736,954 B2 | 5/2004 | Cobley et al. |
| 7,122,108 B2 | 10/2006 | Heber et al. |
| 7,780,839 B2 * | 8/2010 | Egli et al. ............ 205/241 |
| 7,968,444 B2 * | 6/2011 | Luo et al. ............ 438/597 |

FOREIGN PATENT DOCUMENTS

| | | |
|---|---|---|
| EP | 0033644 A1 | 8/1981 |
| EP | 2626449 | 8/2013 |

OTHER PUBLICATIONS

Lira, et al, "Synthesis and characterization of some new mesoionic 1,3-thiazolium-5-thiolates via cyclodehydration and in situ 1,3-dipolar cycloaddition/cycloreversion", Molecules, vol. 7; 2002, pp. 791-800.

* cited by examiner

*Primary Examiner* — Louis Rufo
(74) *Attorney, Agent, or Firm* — John J. Piskorski

(57) ABSTRACT

Silver and tin alloy electroplating baths include complexing agents which enable the electroplating of either silver rich or tin rich alloys. The silver and tin alloy electroplating baths are substantially free of lead. They may be used to electroplate silver and tin alloys in the manufacture of electronic components such as electrical connectors, finishing layers for metallic substrates, decorative applications and solder bumps.

8 Claims, No Drawings

ELECTROPLATING BATHS OF SILVER AND TIN ALLOYS

FIELD OF THE INVENTION

The present invention is directed to electroplating baths of silver and tin alloys and methods of electroplating the silver and tin alloys. More specifically, the present invention is directed to electroplating baths of silver and tin alloys and methods of electroplating the silver and tin alloys where the electroplating baths contain complexing agents which enable silver rich or tin rich alloys.

BACKGROUND OF THE INVENTION

There are two categories of silver and tin alloys. One is silver based or silver rich silver/tin alloys where the silver content is above 50%. Such alloys posses higher hardness and higher wear resistance compared to pure silver and are used in decorative applications. Due to their excellent electrical conductivity they may also be used in electronic connectors to reduce the amount of hard gold. Hard gold is used in electronic connectors as a contact material finish because it has good wear and corrosion resistance. The hard gold provides a low electrical contact resistance required for charge transport; however, the price of gold has been increasing such that it has become a limiting factor for low cost contact finishes. Silver/tin alloys have been used for connector finishes to replace or reduce the amount of hard gold. Such alloys have been produced by plating one or more alternating layers of silver and tin followed by diffusion in a non-oxidizing atmosphere to form the silver/tin alloy. U.S. Pat. No. 5,438,175 discloses an electronic connector having silver/tin as well as silver/palladium flash layers to enable a thin gold finish layer to produce a lower cost article.

The second type of alloy is the tin based alloys where silver content is near eutectic such as around 3.5%. The tin/silver alloy is a softer alloy than the silver/tin alloy and has hardness similar to pure tin. Such alloys may be used as low whiskering, lead-free solders. Of the various electronic applications for tin/silver alloys, there is a current focus in the semiconductor manufacturing industry on wafer-level-packaging (WLP). With wafer-level-packaging, IC interconnects are fabricated en masse on the wafer, and complete IC modules can be built on the wafer before it is diced. Benefits gained using WLP include, for example, increased I/O density, improved operating speeds, enhanced power density and thermal management, and decreased package size.

One of the keys to WLP is the build up of flip-chip conductive interconnect bumps on the wafer. These interconnect bumps serve as electrical and physical connections of the semiconductor components to a printed wiring board. Several methods of forming interconnect bumps on semiconductor devices have been proposed, for example, solder plate bumping, evaporation bumping, conductive adhesive bonding, stencil printing solder bumping, stud bumping, and ball placement bumping. Of these techniques, it is believed that the most cost effective technique for forming fine pitch arrays is solder plate bumping, which involves a combination of a temporary photoresist plating mask and electroplating. This technique is being rapidly adopted as full-area interconnect bump technology for high value-added assemblies such as microprocessors, digital signal processors, and application specific integrated circuits.

Typically tin/lead alloys are used in the formation of solder bumps; however, due to the toxicity of lead the industry has been trying to find acceptable lead-free tin alloys which can be readily co-deposited. Difficulties associated with co-deposition of lead-free tin alloys by electroplating arise when the materials being deposited have significantly different deposition potentials. Complications can arise, for example, when attempting to deposit alloys of tin (−0.137 V) with silver (0.799 V). The industry desires that the composition of the deposits be effectively controlled to prevent melting of the material at too high or too low a temperature for a given application. Poor compositional control can result in either a temperature too high for the components being treated to withstand or, on the other extreme, incomplete formation of the solder joint.

Another problem frequently encountered in electroplating bumps is bump morphology. For example, tin/silver bumps are electrodeposited through photoresist defined vias onto a copper or nickel under bump metal. The photoresist is stripped and the tin/silver is reflowed to form spherical bumps. Uniformity of bump size is important such that all of the bumps make contact with their electrical connections on a corresponding flip-chip component. In addition to bump size uniformity, it is important that a low density and volume of voids are formed during bump reflow. Ideally, no voids are formed during reflow. Voids in the bumps may also lead to interconnection reliability issues when joined to their corresponding flip-chip component. Another problem associated with plating bumps is the formation of nodules on the bump surface which are readily detectable with many conventional scanning electron microscopes. Such nodules may cause reflow voiding, and appearance wise deposits with nodules are not commercially acceptable.

Accordingly, there is a need for stable silver and tin alloy electroplating baths which can provide silver rich silver/tin alloys to replace hard gold and can provide tin rich tin/silver alloys to provide substantially nodule-free and void-free solder bumps.

SUMMARY OF THE INVENTION

Electroplating baths include one or more sources of silver ions, one or more sources of tin ions, one or more compounds having a formula:

where X and Y may be substituted or unsubstituted phenol groups, HO—R— or —R'—S—R"—OH with the proviso that when X and Y are the same they are substituted or unsubstituted phenol groups otherwise X and Y are different and wherein R, R' and R" are the same or different and are linear or branched alkylene radicals having 1 to 20 carbon atoms; and one or more compounds having a formula:

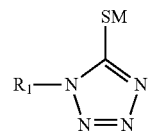

where M is hydrogen, $NH_4$, sodium or potassium and $R_1$ is substituted or unsubstituted, linear or branched ($C_2$-$C_{20}$) alkyl, substituted or unsubstituted ($C_6$-$C_{10}$)aryl.

Methods of electroplating include: contacting a substrate with an electroplating bath including one or more sources of silver ions, one or more sources of tin ions, one or more compounds having a formula:

where X and Y may be substituted or unsubstituted phenol groups, HO—R— or —R'—S—R"—OH with the proviso that when X and Y are the same they are substituted or unsubstituted phenol groups otherwise X and Y are different and where R, R' and R" are the same or different and are linear or branched alkylene radicals having 1 to 20 carbon atoms; and one or more compounds having a formula:

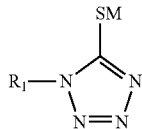

where M is hydrogen, $NH_4$, sodium or potassium and $R_1$ is substituted or unsubstituted, linear or branched ($C_2$-$C_{20}$) alkyl, substituted or unsubstituted ($C_6$-$C_{10}$)aryl; and electroplating a silver and tin alloy on the substrate.

Methods of electroplating also include: providing a semiconductor die having a plurality of interconnect bump pads; forming a seed layer over the interconnect bump pads; contacting the semiconductor die with a silver and tin alloy electroplating bath including one or more sources of silver ions, one or more sources of tin ions, one or more compounds having a formula:

where X and Y may be substituted or unsubstituted phenol groups, HO—R— or —R'—S—R"—OH with the proviso that when X and Y are the same they are substituted or unsubstituted phenol groups otherwise X and Y are different and where R, R' and R" are the same or different and are linear or branched alkylene radicals having 1 to 20 carbon atoms; and one or more compounds having a formula:

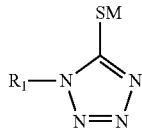

where M is hydrogen, $NH_4$, sodium or potassium and $R_1$ is substituted or unsubstituted, linear or branched ($C_2$-$C_{20}$) alkyl, substituted or unsubstituted ($C_6$-$C_{10}$)aryl; electroplating silver and tin alloy interconnect bumps over the interconnect bump pads; and reflowing the silver and tin alloy interconnect bumps.

The silver and tin alloy baths are free of lead and are stable. They can deposit silver rich or tin rich silver and tin alloys. The silver rich silver/tin alloys provide a bright silver/tin alloy which can be used for decorative purposes and are sufficiently hard to replace hard gold as finishing layers for electrical connectors. The tin rich tin/silver alloy baths can be used to deposit tin/silver alloys which are eutectic or near eutectic. In addition interconnect bumps deposited using the tin/silver alloy baths have substantially uniform morphology and provide substantially void-free interconnect bumps after reflow. The interconnect bumps are also substantially free of nodules.

DETAILED DESCRIPTION OF THE INVENTION

As used throughout the specification, the following abbreviations have the following meanings, unless the context clearly indicates otherwise: ° C.=degrees Centigrade; g=gram; mm=millimeters; cm=centimeters; mL=milliliter; L=liter; ppm=parts per million; DI=de-ionized; nm=nanometers; μm=microns; wt %=percent by weight; A=amps; $A/dm^2$ and ASD=amps per square decimeter; Ah=ampere hours; HV=hardness values; mN=milliNewtons; cps=centipoise; rpm=rotations per minute; IEC=International Electrochemical Commission; and ASTM=American standard testing method. Electroplating potentials are provided with respect to a hydrogen reference electrode. Relating to the electroplating process, the terms "depositing", "coating", "electroplating" and "plating" are used interchangeably throughout this specification. "Halide" refers to fluoride, chloride, bromide and iodide. "Eutectic" means the lowest melting point of an alloy that is obtainable by varying the proportion of components; and having definite and minimum melting points in contrast to other combinations of the same metals. All percentages are by weight, unless otherwise noted. All numerical ranges are inclusive and combinable in any order, except where it is logical that such numerical ranges are construed to add up to 100%.

The silver and tin alloy electroplating baths are substantially free of lead. By "substantially free of lead" is meant that the baths and the silver and tin alloy deposits contain 50 ppm or less of lead. In addition, the silver and tin alloy electroplating baths are preferably free of cyanide. Cyanide is primarily avoided by not employing any silver or tin salts or other compounds in the baths which include the $CN^-$ anion.

The silver and tin alloy electroplating baths are also preferably low foaming. Low foaming electroplating baths are highly desirable in the metal plating industry since the more the electroplating bath foams during plating, the more components the bath looses per unit of time during plating. Loss of components during plating may result in producing commercially inferior silver and tin alloy deposits. Accordingly, workers must closely monitor component concentrations and replace lost components to their original concentration. Monitoring component concentrations during plating may be both tedious and difficult since some of the critical components are included at relatively low concentrations such that they are difficult to accurately measure and replace to maintain optimum plating performance. Low foaming electroplating baths improve alloy composition uniformity and thickness uniformity across a substrate surface and may reduce organics and gas bubbles trapped in the deposits which cause voids in the deposit after reflow.

The electroplating baths include one or more sources of silver ions. Sources of silver ions may be provided by silver salts such as, but are not limited to silver halides, silver gluconate, silver citrate, silver lactate, silver nitrate, silver sulfates, silver alkane sulfonates and silver alkanol sulfonates. When a silver halide is used, it is preferable that the halide is chloride. Preferably the silver salts are silver sulfate, a silver alkane sulfonate or mixtures thereof, and more preferably silver sulfate, silver methane sulfonate or mixtures thereof. The silver salts are generally commercially available or may be prepared by methods described in the literature. Preferably the silver salts are readily water-soluble. The amounts of the one or more silver salts used in the baths depend, for example, on the desired alloy composition to be deposited and operating conditions. In general, silver salts in the bath may range from 0.01 g/L to 100 g/L, typically from 0.02 g/L to 80 g/L. When a bright silver rich alloy is desired, the concentration of silver ions to tin ions in the electroplating bath ranges from 1-12, preferably 1-6.

When silver is the lesser metal of the alloy, the silver salt may range from 0.01 g/L to 20 g/L, typically from 0.01 g/L to 15 g/L.

The electroplating baths include one or more sources of tin ions. Sources of tin ions include, but are not limited to salts, such as tin halides, tin sulfates, tin alkane sulfonates, tin alkanol sulfonates, and acids. When tin halide is used, it is typical that the halide is chloride. The tin compound is preferably tin sulfate, tin chloride or a tin alkane sulfonate, and more preferably tin sulfate or tin methane sulfonate. The tin compounds are generally commercially available or may be prepared by methods known in the literature. Preferably the tin salts are readily water-soluble. The amount of tin salts used in the bath depends on the desired composition of the alloy to be deposited and operating conditions. In general, tin salts may range from 1 g/L to 100 g/L, typically from 5 g/L to 80 g/L. When the alloy is tin rich, the tin salts typically range from 30 g/L to 100 g/L. When tin is the lesser of the two metals, the weight ratio of silver ions to tin ions is as described above.

The silver and tin alloy electroplating baths include one or more compounds having the following formula:

$$X\text{—}S\text{—}Y \tag{I}$$

where X and Y may be substituted or unsubstituted phenol groups, HO—R— or —R'—S—R"—OH with the proviso that when X and Y are the same they are substituted or unsubstituted phenol groups otherwise X and Y are different and where R, R' and R" are the same or different and are linear or branched alkylene radicals having 1 to 20 carbon atoms. Substituent groups on the phenol include, but are not limited to linear or branched ($C_1$-$C_5$)alkyl. In general such compounds are included in the baths in amounts of 0.1 g/L to 22 g/L, typically from 0.5 g/L to 10 g/L.

Examples of compounds where the variables X and Y are phenol groups are 4,4'-thiodiphenol and 4,4'-thiobis(2-methyl-6-tert-butylphenol). Preferably the compound is 4,4'-thiodiphenol.

When X and Y are different the compounds preferably have the following general formula:

$$HO\text{—}R\text{—}S\text{—}R'\text{—}S\text{—}R''\text{—}OH \tag{II}$$

wherein R, R' and R" are the same or different and are linear or branched alkylene radicals having from 1 to 20 carbon atoms, preferably from 1 to 10 carbon atoms, more preferably R and R" have 2 to 10 carbon atoms and R' has 2 carbon atoms. Such compounds are known as dihydroxy bis-sulfide compounds. Preferably the dhihydroxy bis-sulfide compounds are included in the alloy baths over the phenol containing compounds.

Examples of such dihydroxy bis-sulfide compounds are 2,4-dithia-1,5-pentanediol, 2,5-dithia-1,6-hexanediol, 2,6-dithia-1,7-heptanediol, 2,7-dithia-1,8-octanediol, 2,8-dithia-1,9-nonanediol, 2,9-dithia-1,10-decanediol, 2,11-dithia-1,12-dodecanediol, 5,8-dithia-1,12-dodecanediol, 2,15-dithia-1,16-hexadecanediol, 2,21-dithia-1,22-doeicasanediol, 3,5-dithia-1,7-heptanediol, 3,6-dithia-1,8-octanediol, 3,8-dithia-1,10-decanediol, 3,10-dithia-1,8-dodecanediol, 3,13-dithia-1,15-pentadecanediol, 3,18-dithia-1,20-eicosanediol, 4,6-dithia-1,9-nonanediol, 4,7-dithia-1,10-decanediol, 4,11-dithia-1,14-tetradecanediol, 4,15-dithia-1,18-octadecanediol, 4,19-dithia-1,22-dodeicosanediol, 5,7-dithia-1,1'-undecanediol, 5,9-dithia-1,13-tridecanediol, 5,13-dithia-1,17-heptadecanediol, 5,17-dithia-1,2'-uneicosanediol and 1,8-dimethyl-3,6-dithia-1,8-octanediol.

The silver and tin alloy baths also include mercaptotetrazole compounds having the following formula:

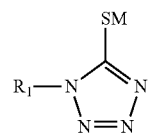

$$\tag{III}$$

where M is hydrogen, $NH_4$, sodium or potassium and $R_1$ is substituted or unsubstituted, linear or branched ($C_2$-$C_{20}$) alkyl, substituted or unsubstituted ($C_6$-$C_{10}$)aryl, preferably substituted or unsubstituted, linear or branched ($C_2$-$C_{10}$) alkyl and substituted or unsubstituted ($C_6$)aryl, more preferably substituted or unsubstituted, linear or branched ($C_2$-$C_{10}$)alkyl. Substituents include, but are not limited to alkoxy, phenoxy, halogen, nitro, amino, substituted amino, sulfo, sulfamyl, substituted sulfamyl, sulfonylphenyl, sulfonylalkyl, fluorosulfonyl, sulfoamidophenyl, sulfonamide-alkyl, carboxy, carboxylate, ureido carbamyl, carbamyl-phenyl, carbamylalkyl, carbonylalkyl and carbonylphenyl. Preferred substituents include amino and substituted amino groups. Examples of mercaptotetrazoles are 1-(2-diethylaminoethyl)-5-mercapto-1,2,3,4-tetrazole, 1-(3-ureidophenyl)-5-mercaptotetrazole, 1-((3-N-ethyl oxalamido)phenyl)-5-mercaptotetrazole, 1-(4-acetamidophenyl)-5-mercapto-tetrazole and 1-(4-carboxyphenyl)-5-mercaptotetrazole. In general, the mercaptotetrazole compounds of formula (III) are included in the bath in amounts of 1 g/L to 200 g/L, typically 5 g/L to 150 g/L.

The combination of one or more compounds of formulae (I) and (II) with one or more of the mercaptotetrazole compounds of formula (III) provides stability to the alloy baths during storage or during electroplating as well as stable alloy compositions over the applicable current density range such that hard bright silver rich silver/tin alloys may be deposited as a replacement for hard gold; or tin rich tin/silver alloys may be deposited to provide solder bumps having good morphology, reduced or free of nodules and have reduced or are free of voids after reflow. In addition, the silver and tin alloy deposits are more resistant to tarnishing than silver. In general, the weight ratio of compounds of formula (III) to the compounds of formula (I) are from 3-300. When the variables X and Y of formula (I) are the same, the weight ratio of the mercaptotetrazoles of formula (III) to the compounds of formula (I) are 25-300, preferably 25-150. When the compounds of formula (II) are included in the bath, the weight ratio of the mercaptotetrazoles to the compounds of formula (II) is 3-30, preferably 3-15.

Any aqueous soluble acid which does not otherwise adversely affect the bath may be used. Suitable acids include, but are not limited to, arylsulfonic acids, alkanesulfonic acids, such as methanesulfonic acid, ethanesulfonic acid and propanesulfonic acid, aryl sulfonic acids such as phenylsulfonic acid and tolylsulfonic acid, and inorganic acids such as sulfuric acid, sulfamic acid, hydrochloric acid, hydrobromic acid and fluoroboric acid. Typically, the acids are alkane sulfonic acids and aryl sulfonic acids. Although a mixture of acids may be used, it is typical that a single acid is used. The acids are generally commercially available or may be prepared by methods known in the literature.

While depending on the desired alloy composition and operating conditions, the amount of acid in the electrolyte compositions may be in the range of 0.01 to 500 g/L or such as from 10 to 400 g/L or such as from 100 to 300 g/L. When the silver ions and tin ions are from metal halides, use of the corresponding acid may be desired. For example, when one or more of tin chloride or silver chloride are used, use of hydrochloric acid as the acid component may be desired. Mixtures of acids also may be used.

Optionally, one or more suppressors may be included in the baths. Typically they are used in amounts of 0.5 to 15 g/L or such as from 1 to 10 g/L. Such suppressors include, but are not limited to alkanol amines, polyethyleneimines and alkoxylated aromatic alcohols. Suitable alkanol amines include, but are not limited to, substituted or unsubstituted methoxylated, ethoxylated, and propoxylated amines, for example, tetra (2-hydroxypropyl)ethylenediamine, 2-{[2-(dimethylamino)ethyl]-methylamino}ethanol, N,N'-bis(2-hydroxyethyl)-ethylenediamine, 2-(2-aminoethylamine)-ethanol, and combinations thereof.

Suitable polyethyleneimines include, but are not limited to, substituted or unsubstituted linear or branched chain polyethyleneimines or mixtures thereof having a molecular weight of from 800-750,000. Suitable substituents include, for example, carboxyalkyl, for example, carboxymethyl, carboxyethyl.

Useful alkoxylated aromatic alcohols include, but are not limited to ethoxylated bis phenol, ethoxylated beta naphthol, and ethoxylated nonyl phenol.

Optionally one or more reducing agents can be added to the baths to assist in keeping the tin in a soluble, divalent state. Suitable reducing agents include, but are not limited to hydroquinone, hydroquinone sulfonic acid, potassium salt and hydroxylated aromatic compounds, such as resorcinol and catechol. Such reducing agents when used in the compositions are present in an amount of 0.01 to 20 g/L or such as from 0.1 to 5 g/L.

For applications requiring good wetting capabilities, one or more surfactants may be included in the baths. Suitable surfactants are known to those skilled in the art, and include any which yield deposits having good solderability, good matte or lustrous finish where desired, satisfactory grain refinement, and are stable in the acidic electroplating baths. Preferably low foaming surfactants are used. Conventional amounts may be used.

Optionally, one or more brighteners may be included. Such brighteners are well known to those skilled in the art. Suitable brighteners include, but are not limited to aromatic aldehydes, such as chlorobenzaldehyde, or derivatives thereof, such as benzyldenel acetone. Suitable amounts for the brighteners are known to those skilled in the art.

Other optional compounds may be added to the baths to provide further grain refinement. Such compounds include, but are not limited to: alkoxylates, such as the polyethoxylated amines JEFFAMINE T-403 or TRITON RW, or sulfated alkyl ethoxylates, such as TRITON QS-15, and gelatin or gelatin derivatives. Alkoxylated amine oxides also may be included. While a variety of alkoxylated amine-oxide surfactants are known, preferably low-foaming amine oxides are used. Such preferred alkoxylated amine oxide surfactants have viscosities of less than 5000 cps measured using a Brookfield LVT Viscometer with a #2 spindle. Typically this viscosity is determined at ambient temperatures. Conventional amounts of such grain refiners may be used. Typically they are included in the baths in amounts of 0.5 g/l to 20 g/L.

Flavone compounds may also be included in the baths as grain refiners. Such flavones compounds include, but are not limited to pentahydroxy flavones, morin, chrysin, quercitin, fisetin, myricetin, rutin and quercitrin. The flavones compounds may be present in amounts of 1 to 200 mg/L, typically from 10 to 100 mg/.L, more typically from 25 to 85 mg/L The electroplating baths are typically prepared by adding to a vessel one or more of the acids, one or more of the compounds of formulae (I), (II) and one or more compounds of formula (III) followed by one or more of the solution soluble silver and tin compounds, one or more optional additives, and the balance water. Preferably the compounds of formulae (I), (II) and (III) are added to the vessel before the solution soluble silver and tin compounds. Once the aqueous bath is prepared, undesired material can be removed, such as by filtration and then water is typically added to adjust the final volume of the bath. The bath may be agitated by any known means, such as stirring, pumping, or recirculating, for increased plating speed. The baths are acidic having a pH of less than 7, typically less than 1, more typically from less than or equal to 1 to 2.

The baths are useful in many plating methods where a silver and tin alloy is desired and are low foaming. Plating methods include, but are not limited to horizontal or vertical wafer plating, barrel plating, rack plating and high speed plating such as reel-to-reel and jet plating. A silver and tin alloy may be deposited on a substrate by the steps of contacting the substrate with the bath and passing a current through the bath to deposit the silver and tin alloy on the substrate. Substrates which may be plated include, but are not limited to, copper, copper alloys, nickel, nickel alloys, brass containing materials, electronic components, such as electrical connectors, and semiconductor wafers such as silicon wafers. The baths may be used for electroplating of electronic components, such as electrical connectors, jewelry, decoratives, and interconnect bump plating applications. The substrate may be contacted with the bath in any manner known in the art.

Current density used to plate the silver and tin alloys depends on the particular plating method. Generally, the current density is 0.05 $A/dm^2$ or more or such as from 1 to 25 $A/dm^2$. Typically lower current densities range from 0.05 $A/dm^2$ to 10 $A/dm^2$. High current densities such as in jet plating with high agitation exceed 10 $A/dm^2$ and may be as high as 25 $A/dm^2$.

The silver and tin alloys may be electroplated at temperatures from room temperature to 55° C., or such as from room temperature to 40° C., or such as from room temperature to 30° C. Typically, silver/tin electroplating is done from room temperature to 55° C. and tin/silver is done from room temperature to 40° C.

The baths may be used to deposit silver and tin alloys of various compositions. When the alloy is a bright silver rich silver/tin alloy, the silver content may range from greater than 50% to 95% with the remainder of the alloy tin, typically the silver content ranges from 60% to 90%. Tin rich alloys contain from greater than 50% tin to 99% tin with the remainder silver, typically the tin rich alloys include 80% to 99% tin with the remainder silver. Such weights are based on measurements taken by either atomic adsorption spectroscopy ("AAS"), X-ray fluorescence ("XRF"), inductively coupled plasma ("ICP") or differential scanning calorimetry ("DSC"). For many applications, the eutectic composition of an alloy may be used. Such tin alloys are substantially free of lead and cyanides.

In general, the silver rich alloys provide a harder deposit than the tin rich alloys. Such silver rich alloys are used to replace hard gold finishes such as in decorative applications for jewelry, other decoratives and for hard finishes on connectors where wear resistance and tarnish resistance is required. Typically such finishes range in thickness from 0.4 μm to 5 μm.

The tin rich tin/silver alloys are typically used for interconnect bump formation for wafer-level-packaging. This involves providing a semiconductor die having a plurality of interconnect bump pads, forming a seed layer over the interconnect bump pads, depositing a tin/silver alloy interconnect bump layer over the interconnect bump pads by contacting the semiconductor die with the tin/silver alloy bath and passing a current through the bath to deposit the tin/silver alloy interconnect bumps on the substrate, and reflowing the interconnect bumps.

In general, a device includes a semiconductor substrate on which is formed a plurality of conductive interconnect bump pads. The semiconductor substrate may be a single-crystal silicon wafer, a silicon-on-sapphire (SOS) substrate, or a silicon-on-insulator (SOI) substrate. The conductive interconnect bump pad may be one or more layers of a metal, composite metal or metal alloy typically formed by physical vapor deposition (PVD) such as sputtering. Typical conductive interconnect bump pad materials include, without limitation, aluminum, copper, titanium nitride, and alloys thereof.

A passivation layer is formed over the interconnect bump pads and openings extending to the interconnect bump pads are formed therein by an etching process, typically by dry etching. The passivation layer is typically an insulating material, for example, silicon nitride, silicon oxynitride, or a silicon oxide, such as phosphosilicate glass (PSG). Such materials may be deposited by chemical vapor deposition (CVD) processes, such as plasma enhanced CVD (PECVD).

An under bump metallization (UBM) structure formed typically of a plurality of metal or metal alloy layers, is deposited over the device. The UBM acts as an adhesive layer and electrical contact base (seed layer) for an interconnect bump to be formed. The layers forming the UBM structure may be deposited by PVD, such as sputtering or evaporation, or CVD processes. Without limitations, the UBM structure may be, for example, a composite structure including in order, a bottom chrome layer, a copper layer, and an upper tin layer.

A photoresist layer is applied to the device, followed by standard photolithographic exposure and development techniques to form a plating mask. The plating mask defines the size and location of a plating via over the I/O pad and UBM. Without limitation, the plating process generally employs a relatively thin photoresist layer, typically from 25 to 70 µm in thickness, while the in via plating process generally employs a relatively thick photoresist layer, typically from 70 to 120 µm in thickness. Photoresist materials are commercially available and well known in the art.

The interconnect bump material is deposited on the device by an electroplating process using the above-described tin rich tin/silver alloy electroplating baths. It may be desired to use tin/silver alloy baths which provide eutectic concentrations. The bump material is electroplated in the areas defined by the plating via. For this purpose, a horizontal or vertical wafer plating system, for example, a fountain plating system, is typically used with a direct current (DC) or pulse-plating technique. In the plating process the interconnect bump material completely fills the via extending above and on a portion of the top surface of the plating mask. This ensures that a sufficient volume of interconnect bump material is deposited to achieve the desired ball size after reflow. In the in via plating process, the photoresist thickness is sufficiently thick such that the appropriate volume of interconnect bump material is contained within the plating mask via. A layer of copper or nickel may be electroplated in the plating via prior to plating the interconnect bump material. Such a layer may act as a wettable foundation to the interconnect bump upon reflow.

Following deposition of the interconnect bump material the plating mask is stripped using an appropriate solvent. Such solvents are well known in the art. The UBM structure is then selectively etched using known techniques, removing all metal from the field area around and between interconnect bumps.

The wafer is then optionally fluxed and is heated in a reflow oven to a temperature at which the interconnect bump material melts and flows into a truncated substantially spherical shape. Heating techniques are known in the art, and include, for example, infrared, conduction, and convection techniques, and combinations thereof. The reflowed interconnect bump is generally coextensive with the edges of the UBM structure. The heat treatment step may be conducted in an inert gas atmosphere or in air, with the particular process temperature and time being dependent upon the particular composition of the interconnect bump material.

The silver and tin alloy baths are free of lead and are stable. Preferably they are free of cyanide compounds. The silver and tin alloys typically remain stable for at least 8 months during idle time in contrast to conventional silver and tin cyanide baths which typically decompose by 2 months idle time. They can deposit silver rich or tin rich silver and tin alloys. The silver rich silver/tin alloys provide a bright silver/tin alloy which can be used for decorative purposes and are sufficiently hard to replace hard gold as finishing layers for electrical connectors. The tin rich tin/silver alloy baths can be used to deposit tin/silver alloys which are eutectic or near eutectic. In addition interconnect bumps deposited using the tin/silver alloy baths have substantially uniform morphology and provide substantially void-free interconnect bumps after reflow. The interconnect bumps are also substantially free of nodules.

The following examples are intended to further illustrate the invention, but are not intended to limit the scope of the invention.

Example 1

A plurality of silver rich silver/tin alloy electroplating baths were prepared having the two formulations in the table below.

TABLE 1

| COMPONENT | FORMULATION I | FORMULATION II |
|---|---|---|
| Silver ions from silver methane sulfonate | 60 g/L | 60 g/L |
| Tin ions from tin methane sulfonate | 15 g/L | 15 g/L |
| Methane sulfonic acid | 162 g/L | 162 g/L |
| 1-(2-Dimethylaminoethyl)-5-mercapto-1,2,3,4-tetrazole | 150 g/L | 150 g/L |
| 3,6-dithiaoctane-1,8-diol | 22 g/L | 0 |
| 4,4-thiodiphenol | 0 | 2 g/L |
| Amine oxide surfactant | 3 g/L | 3 g/L |
| Hydroquinone monosulfonic acid, potassium salt | 1.2 g/L | 1.2 g/L |

Electrolysis of formulation I was then performed. The test was done to show the electrochemical stability of the bath. A brass panel 7.5 cm×10 cm was weighed and then secured in the plating tank. A low current density of 2 ASD was applied to the panel for 15 minutes. The panel was removed from the plating tank and weighed. The amount of silver/tin plated during the 15 minutes was determined. The quantity of electricity was also recorded in ampere hours per liter of the bath. The results indicated that the amount of silver/tin deposited on the brass panels per ampere hours per liter was substantially the same at 2 ASD over a bath age of 100 Ah/L and that the bath was stable during electroplating. The current efficiency was stable and close to 100% during the electrolysis. No decomposition of the bath was observed during electrolysis; however, tin (IV) precipitate was filtered out to keep the turbidity and performance of the bath constant. The plated panels had bright silver/tin deposits.

A Hull cell test was performed for formulation I with a total current of 2 amperes at bath ages of 0 AWL, 30 AWL, 70 Ah/L and 100 Ah/L to determine if the applicable current density range remained stable with the bath age. Plating was done on brass panels 7.5 cm×10 cm for 3 minutes over the current density range. The current density ranged from 0.05 ASD to 10 ASD. In all cases a bright silver/tin deposit was obtained.

Example 2

The two formulations in Table 1 were used to electroplate a silver/tin alloy on brass, copper, copper/beryllium alloy, copper/nickel alloy, copper/tin alloy, nickel coated brass and nickel coated copper panels. Each panel was 7.5 cm×10 cm. The thickness of the panels was 0.25 mm. The nickel coated brass and nickel coated copper panels contained a silver strike layer of less than 100 nm to promote adhesion of the silver/tin layer to the nickel. The silver strike layer had been electroplated on the panels using a silver strike bath containing 2 g/L silver ions, 15 g/L 3,6-dithia-1,8-octanediol, 67 g/L methane sulfonic acid. Electroplating had been done for 0.5 ASD to 1 ASD for 10 seconds to 30 seconds.

The panels were placed in plating tanks containing either Formulation I or Formulation II. The temperatures of the baths were 50° C. and the anode was an iridium oxide insoluble anode. Each electrode was connected to a rectifier. Electroplating was done at 2 ASD. After the panels were electroplated, the physical appearance of the silver/tin deposits was examined. All had bright shinny deposits.

Example 3

A brass cylinder 12 mm in diameter and 8 mm in height was mounted on the axis of an electrical motor and immersed in a plating bath containing Formulation I in Table 1. The motor was set to a rotation speed of 1000 rpm. An insoluble iridium oxide electrode was used as the anode. The electrodes were connected to a rectifier. The electroplating bath was agitated through rotation of the cathode and the bath temperature was maintained at 50° C. Electroplating was done at 0.5, 1, 2, 4, 6, 8, 10, 12, 14, 16, 18 and 20 ASD. The cylinder was changed when moving from one current density to another and the plating time was adjusted to keep the same film thickness. All of the silver/tin alloy deposits had a bright, shiny appearance over the current density range from 0.5 ASD to 16 ASD. Small burned edges were observed at 18 ASD and 20 ASD.

The silver and tin content of each deposit was determined by X-ray fluorescence (XRF) analysis using a FISCHER-SCOPE X-Ray model XDV-SD from Helmut Fischer AG. The XRF analysis showed that the silver/tin alloy layers contained from 75 wt % to 80 wt % silver and from 20 wt % to 25 wt % tin. The mean alloy content of the silver/tin alloy was determined to be 78±2% silver and 22±2% tin. The silver and tin content did not vary considerably over the applicable current density range.

Example 4

Brass panels 5 cm×2.5 cm were electroplated with either a hard gold layer from a gold/cobalt alloy electroplating bath containing 750 mL/L RONOVAL™ CM-97 make up formulation, 17.7 g/L (68.2%) potassium gold cyanide, 20 mL/L RONOVAL™ CM Cobalt Concentrate (available from Dow Electronic Materials) and sufficient DI water to bring the bath to the desired volume; or with the silver/tin alloy electroplating bath of Formulation I in Table 1 above. The brass panels were placed in a plating cell having either electroplating bath. An insoluble platinized titanium electrode was used as the anode. Silver/tin electroplating was done at 50° C. and gold/cobalt was done at 60° C. The current density of the hard gold bath was 4 ASD and the current density of the silver/tin bath was 2 ASD. Electroplating was done until a 5 μm layer of either hard gold containing 0.2 wt % cobalt or silver/tin alloy with 79 wt % silver and 21 wt % tin was deposited on the brass.

The nano Vickers Hardness was tested at room temperature for each plated brass panel using a CSM Instruments Nano-Indentation Tester with a diamond tip. The depth penetration of the indenter tip was less than or equal to 10% of the thickness of the hard gold or silver/tin alloy layers on the brass panels. This assured that the underlying brass did not influence hardness results. The average hardness for the hard gold was determined to be 175 HV and the hardness of the silver/tin alloy layers were determined to be 240 HV. The silver/tin layers were harder than the hard gold layers.

The electroplated brass panels were then annealed for one hour at 150° C. in a conventional convection oven. The hardness of the hard gold and the silver/tin alloy layers were again tested. The hardness of the hard gold layers had an average hardness value of 200 HV and the silver/tin alloy had an average hardness value of 225 HV. Although the annealing process softened the silver/tin alloy layers, the silver/tin alloy layers still had a harder surface than the hard gold. The silver/tin alloys indicated an improved hardness over conventional hard gold.

Example 5

Brass panels 5 cm×10 cm and 0.25 mm thick were electroplated according to the method of Example 4 above with either the silver rich silver/tin alloy or the gold/cobalt hard gold. Electroplating was done to form a 3 μm layer on the panels. The ductility of each plated brass panel was tested using a Bend-tester from SHEEN Instruments Ltd. according to ASTM standard B 489-85. The ductility measured for the hard gold ranged from 4-5% and the ductility of the silver/tin alloy was greater than 7.8%. There was no sign of any cracking during the elongation of the silver/tin alloy samples. Cracking was observed in some of the hard gold samples after 4% and the remainder cracked after 5%. The silver/tin layers had improved ductility over the hard gold samples.

Example 6

Two 5 cm×2.5 cm brass panels 0.25 mm thick were plated with either silver from SILVERON™ GT-101 silver electroplating bath (available from Dow Electronic Materials, Marlborough, Mass.) or the silver/tin alloy bath of formulation I in table 1 above. Each panel was electroplated in a plating cell at 50° C. The anode for the silver/tin bath was a platinized titanium insoluble electrode and a soluble silver anode for the silver bath. Current density was 0.5 ASD. Plating was done until a silver or silver/tin layer 3 μm thick was deposited on the panels.

Each panel was then immersed into a 2 wt % potassium sulfide ($K_2S$) solution for 10 minutes to test the tarnish resistance of each coating. The silver coating had a dark blue appearance which indicated the formation of $Ag_2S$ and severe tarnishing. The silver/tin coating had a light brown color which indicated that the polysulfide reacted with the silver/tin coating very slowly in the presence of sulfur in comparison to the substantially pure silver coating. The silver/tin coating provided a more tarnish resistant coating than the silver coating.

Example 7

A silver rich silver/tin alloy layer was electroplated on a brass panel 1 cm×3 cm using Formulation I. Electroplating was done in an electroplating cell at 1 ASD and at a temperature of 50° C. The anode was a platinized titanium insoluble electrode. Electroplating was done until a silver/tin alloy layer of 3 μm was deposited on the panel. A second brass panel 1 cm×3 cm was plated with bright tin using SOLDERON™ BT-280 Bright Tin electroplating bath (available from Dow Electronic Materials). Electroplating was done at 30° C. at 1 ASD until a 3 μm layer of bright tin was deposited on the panel.

The silver/tin alloy solderability performance was then tested and compared to the solderability performance of the conventional bright tin according to IEC 60068-2-69 ("Solderability testing of electronic components for surface mounting devices (SMD) by the wetting balance method"). Each sample was first immersed into non-activated flux C25R supplied by Metronelec (France) to remove dust, oil and oxides before soldering. The samples were then mounted into the Metronelec/MENESCO ST 50 solderability apparatus (available from Metronelec) which drove them 4 mm into the solder at a speed of 20 mm/second. The solder was a lead-free solder containing 95.5 wt % tin, 3.8 wt % silver and 0.7 wt % copper. Test time was 10 seconds at 245° C. The programmed software enjoined to the apparatus provided the means of measuring the force when the sample was introduced into the solder as well as the force when the solder wetted the surface of the samples. All measurements were made as a function of time. Critical parameters of zero crossing time, time at 5 mN, average force after 5 seconds and angle at 5 seconds were determined from the force measurements as calculated by the software program. The tests were done five times. The average results of the five tests are shown in Table 2 below.

TABLE 2

| Sample | Zero Crossing Time (seconds) | Time at 5 mN (seconds) | Average Force after 5 seconds (mN) | Angle at 5 seconds |
|---|---|---|---|---|
| Ag/Sn 79 wt % Ag, 21 wt % Sn | 0.37 ± 0.05 | 1.64 ± 0.75 | 6.20 ± 0.78 | 31.50 ± 5.71 |
| SOLDERON ™ BT-280 Bright Tin | 0.42 ± 0.06 | 0.82 ± 0.07 | 6.54 ± 0.27 | 27.67 ± 4.19 |

The resulting data showed that the solderability performance of the silver rich silver/tin alloy was similar to that of bright tin. The crossing times for both the silver/tin alloy and the bright tin as well as the time at 5 mN, average force after 5 seconds and angle at 5 seconds fell within the conventional Class I classification where any zero crossing time of less than 1.2 seconds is considered very good in the industry. Class II is considered good and has a zero crossing less than 1.5 seconds, Class III is medium with a zero crossing time of less than 2 seconds and Class IV is considered poor with no zero crossing time. The good solderability performance of the silver/tin alloy indicated that it can be an acceptable substitute for hard gold as coatings on electrical connectors.

Example 8

Three tin rich tin/silver alloy electroplating baths were prepared as shown in Table 3 below.

TABLE 3

| COMPONENT | BATH 1 | BATH 2 | BATH 3 |
|---|---|---|---|
| Tin ions from tin methane sulfonate | 75 g/L | 75 g/L | 75 g/L |
| Silver ions from silver methane sulfonate | 0.5 g/L | 1 g/L | 1.5 g/L |
| Methane sulfonic acid (70 wt %) | 170 g/L | 170 g/L | 170 g/L |
| Ethoxylated bisphenol A[1] | 5 g/L | 5 g/L | 5 g/L |
| 1-(2-dimethylaminoethyl)-5-mercapto-1,2,3,4-tetrazole | 2.4 g/L | 4.8 g/L | 7.2 g/L |
| 3,6-dithiaoctane-1,8-diol | 0.4 g/L | 0.8 g/L | 1.3 g/L |
| Pentahydroxy flavone | 50 ppm | 50 ppm | 50 ppm |
| Hydroquinone monosulfonic acid, potassium salt | 1 g/L | 1 g/L | 1 g/L |

[1]Nonionic surfactant, 13 ethylene oxide units

The pH of all three tin/silver electroplating baths was less than 1. Each tin/silver electroplating bath was used to plate solder bumps in vias. Wafer segments of 4 cm×4 cm with photoresist patterned vias of 75 μm (diameter)×75 μm (depth) and a copper seed layer were immersed in the plating baths in plating cells and plated with tin/silver bumps. Samples were plated in each bath at 8 ASD. The temperature of each bath was at 30° C. An insoluble iridium oxide electrode was used as the anode in each instance. Electroplating was done until a bump of 60 μm was plated.

Morphology of the resulting tin/silver layers was inspected with a Hitachi S2460™ scanning electron microscope. The deposits were uniform, smooth, compact, and free of nodules.

The silver concentrations of the resulting tin-silver layers for the samples were measured by a conventional AAS method. The AAS apparatus used for measurements was manufactured by Varian, Inc. (Palo Alto, Calif.). The method included the following steps: 1) the photoresist was removed; 2) the weight of each tin-silver bump was measured, i.e. average of 10 mg; 3) each tin silver bump was then dissolved in a separate container having 10 to 20 mL of 30-40% nitric acid (more nitric acid was added if needed to dissolve the tin/silver); 4) the dissolved tin/silver from each beaker was then transferred to a separate 100 mL flask and brought to volume with deionized water and mixed; and 5) the amount of silver was measured in each solution and the concentrations of the silver were determined in the deposit using formulation: % Ag=[10×AAS$_{Ag(ppm)}$]/Weight$_{(mg)}$. The amount of each metal in the alloys plated is in Table 4 below.

TABLE 4

| BATH 1 | BATH 2 | BATH 3 |
|---|---|---|
| Sn 99.5 wt %/ Ag 0.5 wt % | Sn 98.8 wt %/ Ag 1.2 wt % | Sn 98.2 wt %/ Ag 1.8 wt % |

All of the baths provided tin rich tin/silver deposits which had good morphology and no observable nodules.

What is claimed is:

1. A tin/silver alloy electroplating bath comprising metal ions consisting of tin ions and silver ions, one or more compounds having a formula:

X—S—Y    (I)

wherein X and Y may be substituted or unsubstituted phenol groups, HO—R— or —R'S—R"—OH with the proviso that when X and Y are the same they are substituted or unsubstituted phenol groups, and wherein R, R' and R" are the same or different and are linear or branched alkylene radicals having 1 to 20 carbon atoms; and one or more mercaptotetrazole compounds having a formula:

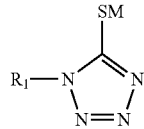    (III)

wherein M is hydrogen, NH$_4$, sodium or potassium and R$_1$ is substituted or unsubstituted, linear or branched (C$_2$-C$_{20}$) alkyl, or substituted or unsubstituted (C$_6$-C$_{10}$) aryl, wherein the tin/silver electroplating bath is free of flavone compounds.

2. The electroplating bath of claim 1, wherein a ratio of silver ions to tin ions ranges from 1-12.

3. The electroplating bath of claim 2, wherein the ratio of silver ions to tin ions ranges from 1-6.

4. The electroplating bath of claim 1, wherein X and Y are different and are HO—R— or —R'—S—R"—OH.

5. The electroplating bath of claim 1, wherein a ratio of the compound of formula (III) to the compound of formula (I) is from 3-300.

6. A method of electroplating tin/silver alloy comprising:
a) contacting a substrate with a tin/silver electroplating bath comprising metal ions consisting of tin ions and silver ions, one or more compounds having a formula:

X—S—Y wherein X and Y may be substituted or unsubstituted phenol group, HO—R— or —R'S—R"—OH with the proviso that when X and Y are the same they are substituted or unsubstituted phenol groups, and wherein R, R' and R" are the same or different and are linear or branched alkylene radicals having 1 to 20 carbon atoms; and one or more mercaptotetrazole compounds having a formula:

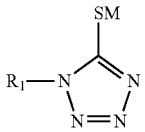

wherein M is hydrogen, NH$_4$, sodium or potassium and R$_1$ is substituted or unsubstituted, linear or branched (C$_2$-C$_{20}$) alkyl, or substituted or unsubstituted (C$_6$-C$_{10}$) aryl, wherein the tin/silver electroplating bath is free of flavone compounds; and
b) electroplating a silver and tin alloy on the substrate.

7. A method of electroplating a tin/silver alloy comprising:
a) providing a semiconductor die having a plurality of interconnect bump pads;
b) forming a seed layer over the interconnect bump pads;
c) contacting the semiconductor die with a tin/silver alloy electroplating bath comprising metal ions consisting of tin ions and silver ions, one or more compounds having a formula:

X—S—Y wherein X and Y may be substituted or unsubstituted phenol group, HO—R— or —R'—S—R"—OH with the proviso that when X and Y are the same they are substituted or unsubstituted phenol groups, and wherein R, R' and R" are the same or different and are linear or branched alkylene radicals having 1 to 20 carbon atoms; and one or more mercaptotetrazole compounds having a formula:

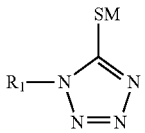

wherein M is hydrogen, NH$_4$, sodium or potassium and R$_1$ is substituted or unsubstituted, linear or branched (C$_2$-C$_{20}$) alkyl, or substituted or unsubstituted (C$_6$-C$_{10}$) aryl, wherein the tin/silver alloy electroplating bath is free of flavone compounds;
d) electroplating silver and tin alloy interconnect bumps over the interconnect bump pads; and
e) reflowing the silver and tin alloy interconnect bumps.

8. The method of claim 7, wherein the one or more mercaptotetrazoles are chosen from 1-(2-diethylaminoethyl)-5-mercapto-1,2,3,4-tetrazole, 1-(3-ureidophenyl)-5-mercaptotetrazole, 1-((3-N-ethyl oxalamido)phenyl)-5-mercaptotetrazole, 1-(4-acetamidophenyl)-5-mercapto-tetrazole and 1-(4-carboxyphenyl)-5-mercaptotetrazole.

\* \* \* \* \*